United States Patent
Hwang

(10) Patent No.: US 10,103,184 B2
(45) Date of Patent: Oct. 16, 2018

(54) LATCH CIRCUIT, DOUBLE DATA RATE RING COUNTER BASED ON THE LATCH CIRCUIT, HYBRID COUNTING DEVICE, ANALOG-DIGITAL CONVERTING DEVICE, AND CMOS IMAGE SENSOR

(71) Applicant: SK hynix Inc., Gyeonggi-do (KR)

(72) Inventor: Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 235 days.

(21) Appl. No.: 15/130,697

(22) Filed: Apr. 15, 2016

(65) Prior Publication Data

US 2017/0133418 A1    May 11, 2017

(30) Foreign Application Priority Data

Nov. 9, 2015 (KR) .................. 10-2015-0156616

(51) Int. Cl.
| | |
|---|---|
| H03M 1/12 | (2006.01) |
| H01L 27/146 | (2006.01) |
| H03K 3/037 | (2006.01) |
| H03K 23/54 | (2006.01) |
| H03K 3/356 | (2006.01) |
| H03M 1/50 | (2006.01) |

(52) U.S. Cl.
CPC .. H01L 27/14609 (2013.01); H01L 27/14643 (2013.01); H03K 3/037 (2013.01); H03K 3/356121 (2013.01); H03K 23/54 (2013.01); H03M 1/123 (2013.01); H03M 1/50 (2013.01)

(58) Field of Classification Search
CPC ........ H01L 27/14609; H01L 27/14643; H03K 3/356121; H03K 23/54; H03K 3/037; H03M 1/50
USPC .................................................. 341/164, 155
See application file for complete search history.

(56) References Cited

U.S. PATENT DOCUMENTS 4,646,332 A *  2/1987 Sajor .................... H03K 23/542
                                                    377/107
6,882,192 B2 *  4/2005 Gau .......................... G06F 5/06
                                                    327/141

(Continued)

FOREIGN PATENT DOCUMENTS

| KR | 1020100092542 | 8/2010 |
| KR | 1020110033583 | 3/2011 |

*Primary Examiner* — Brian Young
(74) *Attorney, Agent, or Firm* — IP & T Group LLP

(57) ABSTRACT

Disclosed are a latch circuit receiving a negative output of a next stage latch circuit as a feedback input, a double data rate (DDR) ring counter based on the latch circuit to perform DDR counting of pulse periods and reduce the number of toggles, a hybrid counting device counting lower-bit portion by using the latch-based DDR ring counter and upper-bit portion by using a binary counter, and an analog-to-digital converting device and a CMOS image sensor employing the hybrid counting device. A double data rate ring counter may include a plurality of latches coupled in a ring type. The plurality of latches may include positive-edge-triggered latches and negative-edge-triggered latches arranged alternately. A current stage latch receives an output of a previous latch stage to shift to a next latch stage according to a counter clock, receives an output of the next latch stage to check a data shift to the next latch stage, and falls to a low level if the data shift is checked.

22 Claims, 7 Drawing Sheets

(56) References Cited

U.S. PATENT DOCUMENTS

| | | | |
|---|---|---|---|
| 6,950,490 B1 * | 9/2005 | Koh | H03K 21/40 |
| | | | 377/122 |
| 6,956,423 B2 * | 10/2005 | Neff | H03K 5/1504 |
| | | | 327/291 |
| 9,680,478 B2 * | 6/2017 | Karalar | H03K 23/54 |

* cited by examiner

LATCH CIRCUIT, DOUBLE DATA RATE RING COUNTER BASED ON THE LATCH CIRCUIT, HYBRID COUNTING DEVICE, ANALOG-DIGITAL CONVERTING DEVICE, AND CMOS IMAGE SENSOR

CROSS-REFERENCE TO RELATED APPLICATIONS

The present application claims priority of Korean Patent Application No. 10-2015-0156616, filed on Nov. 9, 2015, which is incorporated herein by reference in its entirety.

BACKGROUND

1. Field

Various embodiments of the present invention relate generally to a complementary metal oxide semiconductor (CMOS) image sensor and, more particularly, a latch circuit, a double data rate ring counter based on the latch circuit, a hybrid counting device employing the double data rate ring counter, an analog-to-digital converting device employing the hybrid counting device, and a CMOS image sensor employing the analog-to-digital converting device.

2. Description of the Related Art

In a counter structure where a certain period of a pulse signal, e.g., a comparator output signal, is counted by using a reference clock or a counter clock in a CMOS image sensor, for example, power consumption may increase generally in proportion to the number of toggles in the counter.

For example, in a case where a 10-bit binary counter, such as a typical ring counter, carries out a full counting and each of the latch circuits in the counter is designed based on two flip-flops connected in cascade, the counter may have 2046 toggles including 512*2 toggles in a first least significant bit (LSB), 256*2 toggles in a second LSB, 128*2 toggles in a third LSB, 64*2 toggles in a fourth LSB, 32*2 toggles in a fifth LSB, 16*2 toggles in a sixth LSB, 8*2 toggles in a seventh LSB, 4*2 toggles in a eighth LSB, 2*2 toggles in a ninth LSB, and 1*2 toggles in a most significant bit (MSB).

Since the number of toggles in a lower-bit portion may be much greater than in an upper-bit portion so, for example, 1792 toggles of the 2046 toggles may be concentrated in three lowermost bit positions, much power may be consumed in the stages corresponding to the lower-bit portion.

SUMMARY

Various embodiments of the present invention are directed to a latch circuit receiving a negative output of a next stage as a feedback input.

Also, various embodiments of the present invention are directed to a double data rate (DDR) ring counter implemented on a basis of the latch circuit to perform DDR counting of pulse periods and reduce the number of toggles.

Further various embodiments of the present invention are directed to a hybrid counting device in which lower-bit portion is implemented by using the latch-based DDR ring counter and upper-bit portion is implemented by using a binary counter.

Additionally, various embodiments of the present invention are directed to an analog-to-digital converting device and a CMOS image sensor employing the hybrid counting device.

In accordance with an embodiment of the present invention, a latch circuit may include an input unit suitable for using a counter clock and an output of a preceding latch stage; a feedback input unit suitable for using the counter clock and an output of a next latch stage; and a latching unit suitable for holding data according to a state of the counter clock.

When the output of the next latch stage is changed to a high level, the feedback input unit receives a negative output of the next latch stage to change an output of a current latch stage to a low level according to the counter clock.

Phases of the counter clock are arranged to be opposite to each other between the preceding latch stage and a current latch stage and between the current latch stage and the next latch stage.

In accordance with another embodiment of the present invention, a double data rate ring counter may include a plurality of latches coupled in a ring type, wherein the plurality of latches comprise positive-edge-triggered latches and negative-edge-triggered latches arranged alternately, and wherein a current latch stage receives an output of a preceding latch stage to shift to a next latch stage according to a counter clock, receives an output of the next latch stage to check a data shift to the next latch stage, and falls to a low level if the data shift is made.

The double data rate ring counter may further include a first latch having a set input terminal and suitable for receiving the counter clock from a clock controller through a clock terminal thereof, receiving a positive output of an n-th latch through a first input terminal thereof, and receiving a negative output of the next latch stage through a second input terminal thereof; an (n-1)-th latch having a reset input terminal and suitable for receiving the counter clock through a clock terminal or an inverted clock terminal thereof, receiving a positive output of the first latch through a first input terminal thereof, and receiving a negative output of the next latch stage through a second input terminal thereof; and the n-th latch having a reset input terminal and suitable for receiving the counter clock through an inverted clock terminal thereof, receiving a positive output of the (n-1)-th latch through a first input terminal thereof, and receiving a negative output of the first latch through a second input terminal thereof.

Each of the plurality of latches may include an input unit suitable for using the counter clock and the output of the preceding latch stage; a feedback input unit suitable for using the counter clock and the output of the next latch stage; and a latching unit suitable for holding data according to a state of the counter clock.

When the output, of the next latch stage is changed to a high level, the feedback input unit may receive a negative output of the next latch stage and change an output of a current latch stage to a low level according to the counter clock.

Phases of the counter clock may be arranged to be opposite to each other between the preceding latch stage and the current latch stage and between the current latch stage and next latch stage.

In accordance with another embodiment of the present invention, a hybrid counting device may include a latch-based double data rate ring counter suitable for counting a signal according to a counter clock and outputting lower bits of a count result in a decimal code; and a binary counter suitable for receiving a most significant bit of the count result from the latch-based double data rate ring counter and counting the most significant bit to output upper bits of the count result.

The hybrid counting device of claim 9 may include a decoder suitable for receiving the lower bits of the count result of the decimal code and converting the decimal code to a binary code to output the lower bits of the count result of the binary code.

The decoder may include a plurality of AND gates each suitable for performing an AND operation on positive outputs in the decimal code from two adjacent latches in latch-based double data rate ring counter to convert the decimal code to the binary code and output the lower bits of the count result of the binary code.

The latch-based double data rate ring counter may include a plurality of latches arranged in a ring type; wherein the plurality of latches comprises positive-edge-triggered latches and negative-edge-triggered latches arranged alternately, and wherein a current latch stage receives an output of a preceding latch stage to shift to a next latch stage according to a counter clock, receives an output of the next latch stage to check a data shift to the next latch stage, and falls to a low level if the data shift is made.

The latch-based double data rate ring counter may further include a first latch having a set input terminal and suitable for receiving the counter clock from a clock controller through a clock terminal thereof, receiving a positive output of an n-th latch through a first input terminal thereof, and receiving a negative output of the next latch stage through a second input terminal thereof; an (n−1)-th latch having a reset input terminal and suitable for receiving the counter clock through a clock terminal or an inverted clock terminal thereof, receiving a positive output of the first latch through a first input terminal thereof, and receiving a negative output of the next latch stage through a second input terminal thereof; and the n-th latch having a reset input terminal and suitable for receiving the counter clock through an inverted clock terminal thereof, receiving a positive output of the (n−1)-th latch through a first input terminal thereof, and receiving a negative output of the first latch through a second input terminal thereof.

Each of the plurality of latches may include an input unit suitable for using the counter clock and the output of the preceding latch stage; a feedback input unit suitable for using the counter clock and the output of the next latch stage; and a latching unit suitable for holding data according to a state of the counter clock.

When the output of the next latch stage is changed to a high level, the feedback input unit may receive a negative output of the next latch stage and change an output of the current latch stage to a low level according to the counter clock.

In the latch-based double data rate ring counter, phases of the counter clock may be arranged to be opposite to each other between the preceding latch stage and the current stage latch and between the current stage latch and next stage latch.

In accordance with another embodiment of the present invention, an analog-to-digital converting device may include a comparator suitable for comparing an analog signal with a reference signal and generating a comparator output signal; and a hybrid counter suitable for performing a counting operation on the comparator output signal to generate a digital signal corresponding to the analog signal, wherein the hybrid counter includes a latch-based double data rate ring counter suitable for counting the analog signal according to a counter clock and outputting lower bits of the digital signal in a decimal code; and a binary counter suitable for receiving a most significant bit of a count result from the latch-based double data rate ring counter and counting the most significant bit to output upper bits of the digital signal.

The hybrid counter may further include a decoder suitable for receiving the lower bits of the digital signal of the decimal code and converting the decimal code to a binary code to output the lower bits of the digital signal of the binary code.

The latch-based double data rate ring counter may include a plurality of latches arranged in a ring type; wherein the plurality of latches comprises positive-edge-triggered latches and negative-edge-triggered latches arranged alternately, and wherein a current latch stage receives an output of a preceding latch stage to shift to a next latch stage according to a counter clock, receives an output of the next latch stage to check a data shift to the next stage latch, and falls to a low level if the data shift is made.

Each of the plurality of latches may include an input unit suitable for using the counter clock and the output of the preceding latch stage; a feedback input unit suitable for using the counter clock and the output of the next latch stage; and a latching unit suitable for holding data according to a state of the counter clock.

In accordance with another embodiment of the present invention, a CMOS image sensor may include a pixel array suitable for generating an analog signal corresponding to an incident light; an analog-to-digital converter suitable for comparing the analog signal with a reference signal and generating a digital signal corresponding to the analog signal by use of a hybrid counter; and a controller suitable for controlling the pixel array and the analog-to-digital converter, wherein the hybrid counter includes a latch-based double data rate ring counter suitable for counting the analog signal according to a counter clock and outputting lower bits of the digital signal in a decimal code; and a binary counter suitable for receiving a most significant bit of a count result from the latch-based double data rate ring counter and counting the most significant bit to output upper bits of the digital signal.

The hybrid counter may further include a decoder suitable for receiving the lower bits of the digital signal of the decimal code and converting the decimal code to a binary code to output the lower bits of the digital signal of the binary code.

The latch-based double data rate ring counter may include a plurality of latches arranged in a ring type; wherein the plurality of latches comprises positive-edge-triggered latches and negative-edge-triggered latches arranged alternately, and wherein a current latch stage receives an output of a preceding latch stage to shift to a next latch stage according to a counter clock, receives an output of the next latch stage to check a data shift to the next latch stage, and falls to a low level if the data shift is made.

Each of the plurality of latches may include an input unit suitable for using the counter clock and the output of the preceding latch stage; a feedback input unit suitable for using the counter clock and the output of the next latch stage; and a latching unit suitable for holding data according to a state of the counter clock.

According to embodiments of the present invention, data rate of the counter may be enhanced since the ring type counter is implemented to operate in the double data rate.

Also, according to embodiments of the present invention, the ring type counter is implemented on a basis of latches rather than flip-flops, which may reduce the size of the counter and the number of toggles in the counter.

Also, according to embodiments of the present invention, the reduction of the number of toggles may bring about reduction of the power consumption in the ring type counter and the other kind of devices employing the ring type counter.

Also, according to embodiments of the present invention the latch circuit may receive a negative output of a next stage as a feedback input.

Also, according to embodiments of the present invention, the hybrid counting device is configured such that a lower-bit portion is implemented by using a latch-based DDR ring counter and an upper-bit portion is implemented by using a binary counter.

DETAILED DESCRIPTION

Figure 1:
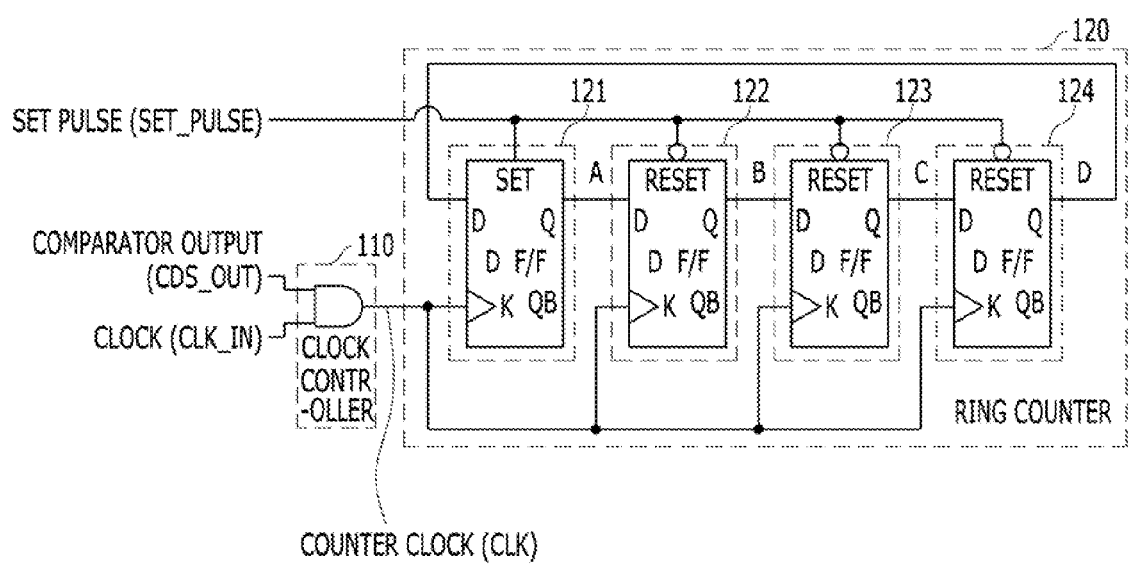
FIG. 1 is a circuit diagram of a ring counter in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete. Throughout the disclosure, like reference numerals refer to like parts throughout the various figures and embodiments of the present invention.

In this disclosure, when one part is referred to as being 'connected' to another part, it should be understood that the former can be 'directly connected' to the latter, or 'electrically connected' to the latter via an intervening part. Furthermore, the terms 'comprises', 'includes,' 'has' and the like when used herein should be understood to be inclusive terms allowing the presence of other non-stated elements in addition to those elements expressly stated. Moreover, a singular term may include plural forms unless expressly stated otherwise.

Referring now to FIG. 1 a circuit diagram of a ring counter is provided in accordance with an embodiment of the present invention. A ring counter 120 used for a single-slope, analog-to-digital converter, for example, may count a certain pulse period of a data signal, e.g., a comparator output signal, according to a counter clock. For this operation, a clock controller 110 may receive a comparator output signal CDS_OUT and a clock input signal CLK_IN and may generate a counter clock CLK synchronized with the comparator output signal CDS_OUT to output to the ring counter 120. The clock controller 110 may be implemented by an AND gate performing an AND operation on the comparator output signal CDS_OUT and the clock input signal CLK_IN.

The ring counter 120 may include a plurality of stages, for example, first to fourth stages 121-124 coupled in a ring type. The first stage 121 may include a D flip-flop having a set terminal SET, an input terminal D for receiving an output signal Q from the fourth stage 124 and a clock terminal k for receiving the counter clock CLK from the clock controller 110I. The second stage 122 may include a D flip-flop having a reset terminal RESET, an input terminal D for receiving an output signal Q of the first stage 121 and a clock terminal K for receiving the counter clock CLK from the clock controller 110. The third stage 123 may include a D flip-flop having a reset terminal, an input terminal D for receiving an output signal Q of the second stage 122 and a clock terminal for receiving the counter clock CLK from the clock controller 110. The fourth stage 124 may include a D flip-flop having a reset terminal RESET, an input terminal D for receiving an output signal Q of the third stage 123 and a clock terminal K for receiving the counter clock CLK from the clock controller 110.

The ring counter 120 may include further stages depending on the number of bits of a digital signal indicating a count result. Although it is shown in FIG. 1 that the ring counter 120 may include only the first to fourth stages 121-124 for convenience of description, the number of stages in the ring counter 120 may be varied according to the number of bits of the digital signal or a binary code. FIG. 1 illustrates an example that the ring counter 120 may generate the binary code of four bits, A to D.

As shown in FIG. 1, the ring counter 120 which is based on flip-flops may shift pulses at every clock cycle and repeat the shifting operation for new pulses after the clock cycles corresponding to the number of the stages have passed. For example, the ring counter 120 may have a form of a one-clock shift register, in which each of a plurality of stages 121-124 in the ring counter 120 may sequentially shift one pulse to the next stage in response to a counter clock received through the clock terminal.

Figure 2:
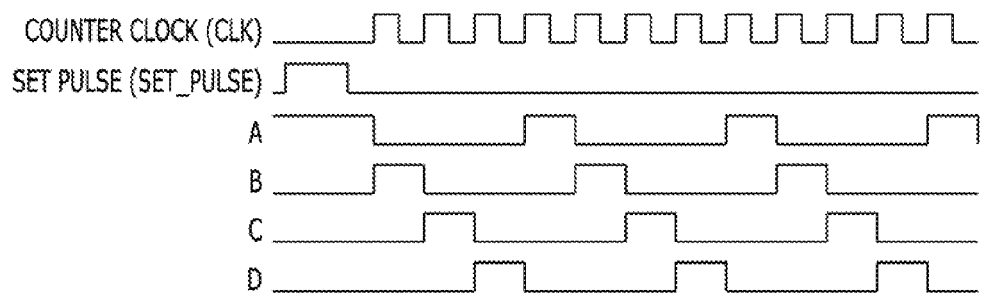
FIG. 2 is a timing chart of the ring counter of FIG. 1.

FIG. 2 is a timing chart of the ring counter of FIG. 1.

For example, an output A of the first stage 121 may be set to a high level by the set pulse SET_PULSE, and outputs B to D of the second to fourth stages 122-124 may be reset to a low level by the set pulse SET_PULSE. Each of the first to fourth stages 121 to 124 may sequentially shift the output A, B, C or D from its preceding stage by one clock in response to the counter clock CLK inputted through respective clock terminals Qb. For example, at a first rising edge of the counter clock CLK, the high level of output A may be shifted from the first stage 121 to the second stage 122, the low level of output B may be shifted from the second stage 122 to the third stage 123, the low level of output C may be shifted from the third stage 123 to the fourth stage 124, and the low level of output D may be shifted from the fourth stage 124 to the first stage 121.

Subsequently, at a second rising edge of the counter clock CLK inputted to the clock terminals Qb, the outputs A to D of each stage may be shifted to the next stages. Accordingly, the output C of the third stage 123 may be toggled to the high level. Next, at a third rising edge of the counter clock CLK, the outputs A to D of each stage may be shifted to the next stages. Accordingly, the output D of the fourth stage 124 may be toggled to the high level. Afterwards, the outputs A to D of each stage may be shifted to the next stages. Accordingly, the output A of the first stage 121 may be toggled to the high level.

In the ring counter 120 of FIG. 1, however, there may be 2046 toggles in case of full counting for a 10-bit counter structure, and the number of toggles in lower-bit portion may be much larger than in upper-bit portion. For example, 1792 toggles of the 2046 toggles are concentrated in three stages corresponding to three lowermost bit positions. As a result, much power may be consumed in the stages corresponding to the lower-bit portion.

Accordingly, in order to reduce the power consumption, in an embodiment of a counter according to the present invention, a lower bit portion corresponding to lower eight bits for example, subject to the large number of toggles may be implemented using a latch-based double data rate (DDR) ring counter, and a higher bit portion corresponding to upper two bits, for example, subject to the small number of toggles may be implemented using a ripple counter. The DDR ring counter may be implemented in conjunction with the latch-based DDR ring counter.

In an embodiment, the DDR ring counter is implemented by using a ring type shift register that is based on a modified latch structure instead of a flip-flop based ring counter so as to enable double data rate counting, and may reduce by half the number of toggles.

In other words, the DDR ring counter may be implemented based on the latch-based DDR ring type of shift register in order to enable the double data rate counting and reduce the number of toggles. If a lower bit portion corresponding to lower three bits is implemented using the latch-based eight-bit DDR ring counter, the number of toggles will be reduced to be 1024 (=128 toggles×8 stages), leading to a reduction of the toggles by 43% compared with the number of toggles, 1792, in the conventional ring counter of FIG. 1.

Figure 3:
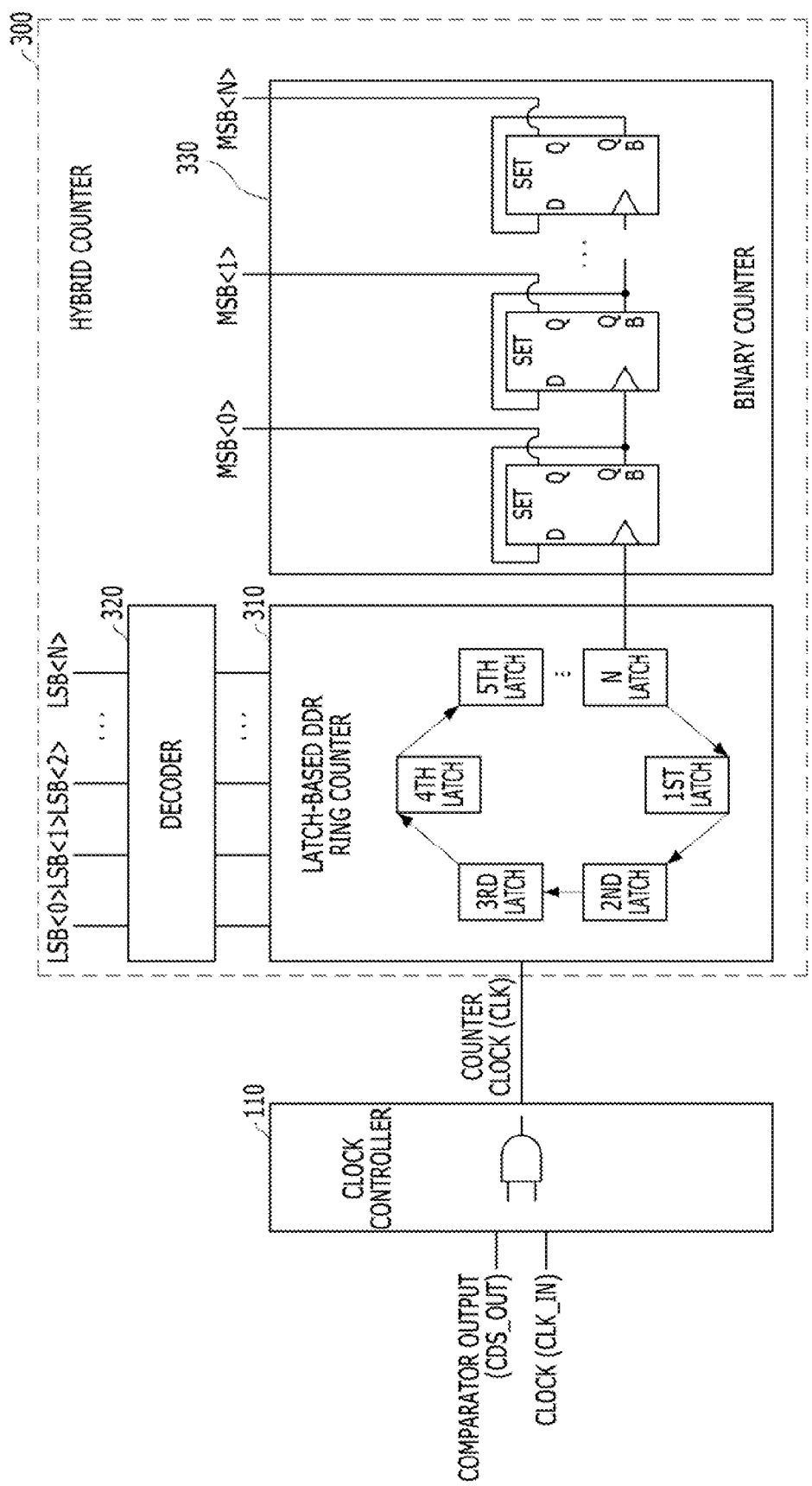
FIG. 3 is a schematic diagram of a hybrid counter in accordance with an embodiment of present invention.

As shown in FIG. 3, a hybrid counter 300 in accordance with an embodiment of the present invention may include a latch-based DDR ring counter 310 configured to count lower bits at a double data rate according to a counter clock CLK and output the count result in a decimal code, a decoder 320 configured to decode the decimal code of the count result from the latch-based DDR ring counter 310 into a binary code to output the count result of the binary code and a binary counter 330 configured to receive and count a most significant bit from the latch-based DDR ring counter 310 to output upper bits.

The hybrid counter 300 may count a certain pulse period of a data signal, e.g., a comparator output signal, according to a counter clock. For this operation, a clock controller 110 may receive a comparator output signal CDS_OUT and a clock CLK_IN, and generate a counter clock CLK synchronized with the comparator output signal CDS_OUT to output to the hybrid counter 300. The clock controller 110 may be implemented by a AND gate performing an AND operation on the comparator output signal CDS_OUT and the clock input signal CLK_IN.

In the latch-based DDR ring counter 310, positive-edge-triggered latches and negative-edge-triggered latches may be arranged alternately. A current latch stage may receive an output of a preceding latch stage to shift to a next latch stage according to the counter clock. The current latch stage may receive an output of the next stage latch to check as to whether the output of the preceding latch stage was shifted to the next latch stage. If so, the current latch stage may be reduced to the low level. As a result, the latch-based DDR ring counter 310 may operate in double data rate (DDR), which is described below in detail with reference to FIGS. 4 and 5.

The decoder 320 may be an optional component configured to receive the count result of the decimal code from the latch-based DDR ring counter 310 perform AND operations to convert the decimal code to the binary code, and output the count result of the binary code. Details of the decoder 320 are described below with reference to FIG. 4.

The binary counter 330 may be implemented by a ripple counter configured to receive the most significant bit from the count result of the latch-based DDR ring counter 310 through its counter terminal, count the most significant bit, and output the upper bits of the overall count result of the hybrid counter 300. The ripple counter may include a plurality of stages corresponding to the number of bits of a digital signal corresponding to the count result.

The ripple counter may have a cascade structure in which the plurality of stages may be sequentially toggled by outputs of respective preceding stages. For example, the first stage may be toggled in response to a signal inputted through a clock terminal thereof. The second stage may be toggled in response to an output of the first stage inputted through a clock terminal thereof, and the n-th stage may be toggled in response to an output of the (n−1)-th stage inputted through a clock terminal thereof. A first bit signal MSB<0> output by the first stage may be toggled at a rising edge of the clock CLK. A second bit signal MSB<1> output by the second stage may be toggled at a falling edge of the output of the first stage. As a result, periods of the first to n-th bit signals may be sequentially doubled.

As described above, according to an embodiment of the present invention, the latch-based DDR ring counter 310 may count pulse periods, and output its count result as lower bits (e.g., lower eight bits) of the count result of the hybrid counter 300 in decimal code. The latch-based DDR ring counter 310 may feed the most significant bit of its count result to the clock terminal of the binary counter 330, so that the most significant bit may be used as a clock signal for operating the binary counter 330. As a result, the binary counter 330 may count the most significant bit, and output its count result as upper bits (e.g., upper two bits) of the count result of the hybrid counter 300.

Followings are examples of counting "62" by use of a conventional binary counter and a hybrid counter in accordance with an embodiment of the present invention.

1. Counting of "62" by use of a conventional 10-bit binary counter: "0000111110"

2. Counting of "62" by use of a hybrid counter (employing an 8-stage DDR ring counter, for example) in accordance with an embodiment of the present invention:

$$62 = 8 \times 7 + 6$$

That is, when "62" is divided by "8," the quotient is "7" and the remainder is "6".

The remainder "6" may be counted by the latch-based DDR ring counter 310, and outputted in a decimal form "00100000." The quotient "7" may be counted by the binary counter 330 from the most significant bit of the count result of the latch-based DDR ring counter 310, and outputted in a binary form "00000111."

Figure 4:
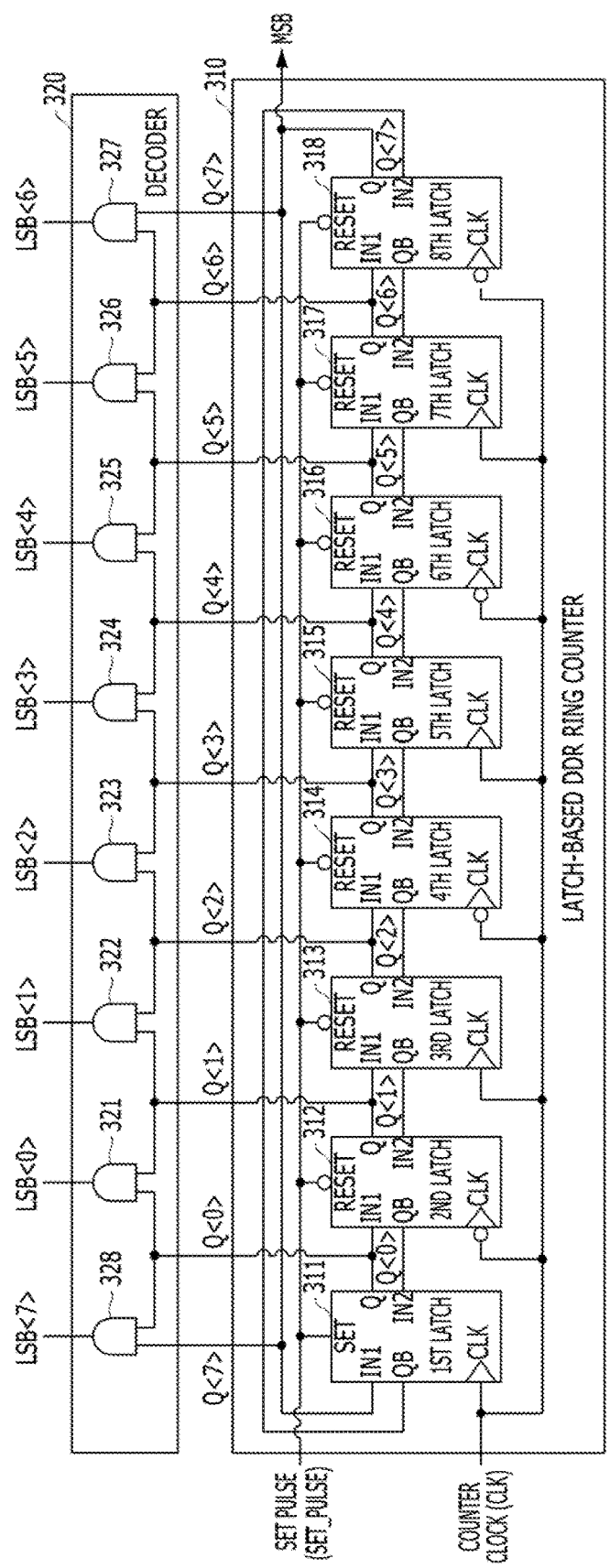
FIG. 4 is a circuit diagram of a latch-based DDR ring counter and a decoder in accordance with an embodiment of present invention.

As shown in FIG. 4, a latch-based DDR ring counter 310 in accordance with an embodiment of present invention may include a plurality of latches 311-318 coupled in a ring type. Among the plurality of latches 311-318, the latches 311, 313, 315 and 317 may be positive-edge-triggered latches while the latches 312, 314, 316, and 318 may be negative-edge-triggered latches. The positive-edge-triggered latches and the negative-edge-triggered latches may be arranged alternately. Thus, a current latch stage may receive an output of a preceding latch stage to shift to a next latch stage according to the counter clock. The current latch stage may receive an output of the next latch stage to check as to whether the output of the preceding latch stage was shifted to the next latch stage. If so, the current latch stage may be reduced to the low level. As a consequence, the latch-based DDR ring counter 310 may operate in double data rate (DDR).

Referring FIG. 4, the latch-based DDR ring counter 310 may include first to eighth latches 311-318 coupled in a ring type. The first latch 311 may be a positive-edge-triggered latch having a clock terminal CLK and a set terminal SET for receiving a set pulse signal SET_PULSE. The third latch 313, the fifth latch 315, and the seventh latch 317 may be positive-edge-triggered latches each of which has a clock terminal CLK and a reset terminal RESET for receiving a set pulse signal SET_PULSE. The second latch 312, the fourth latch 314, the sixth latch 316, and the eighth latch 318 may be negative-edge-triggered latches, each of which has an inverted clock terminal and a reset terminal RESET for receiving a set pulse signal SET_PULSE.

The first latch 311 may receive the counter clock CLK from the clock controller 110 through its clock terminal, receive a positive output Q<7> of the eighth latch 318 through its first input terminal IN1, and receive a negative output QB of the second latch 312 through its second input terminal IN2. The second latch 312 may receive the counter clock CLK through its inverted clock terminal, receive a positive output Q<0> of the first latch 311 through its first input terminal IN1, and receive a negative output QB of the third latch 313 through its second input terminal IN2. The third latch 313 may receive the counter clock CLK through its clock terminal, receive a positive output Q<1> of the second latch 312 through its first input terminal IN1, and receive a negative output QB of the fourth latch 314 through its second input terminal IN2. The fourth latch 314 may receive the counter clock CLK from through its inverted clock terminal, receive a positive output Q<2> of the third latch 313 through its first input terminal IN1, and receive a negative output QB of the fifth latch 315 through its second input terminal IN2. The fifth latch 315 may receive the counter clock CLK through its clock terminal, receive a positive output Q<3> of the fourth latch 314 through its first input terminal IN1, and receive a negative output QB of the sixth latch 316 through its second input terminal IN2. The sixth latch 316 may receive the counter clock CLK from through its inverted clock terminal, receive a positive output Q<4> of the fifth latch 315 through its first input terminal IN1, and receive a negative output QB of the seventh latch 317 through its second input terminal IN2. The seventh latch 317 may receive the counter clock CLK through its clock terminal, receive a positive output Q<5> of the sixth latch 316 through its first input terminal IN1 and receive a negative output QB of the eighth latch 318 through its second input terminal IN2. The eighth latch 318 may receive the counter clock CLK from through its inverted clock terminal, receive a positive output Q<6> of the seventh latch 317 through its first input terminal IN1, and receive a negative output QB of the first latch 311 through its second input terminal IN2.

The number of stages in the latch-based DDR ring counter 310 may be varied depending on the number of bits of a digital signal corresponding to a count result. Although it is shown in FIG. 4 that the latch-based DDR ring counter 310 may include eight stages, such as the first to eighth latches 311-318, for convenience of description, the number of stages in the latch-based DDR ring counter 310 may be varied according to the number of bits of the digital signal or a decimal code, Q<0> through Q<7> for example.

As discussed above, the positive-edge-triggered latches 311, 313, 315, and 317 and the negative-edge-triggered latches 312, 314, 316, and 318 may be arranged alternately in the latch-based DDR ring counter 310. Also, the first latch 311 may have a set input terminal while the other latches, the second to eighth latches 312-318 may have respective reset input terminals. Although it is shown in FIG. 4 that the first latch 311 may receive the set pulse signal SET_PULSE from an external controller, e.g., a timing generator (not shown), and the second to eighth latches 312-318 may receive and internally invert the set pulse signal SET_PULSE, the second to eighth latches 312-318 may be implemented to receive a separate reset pulse signal from the external controller.

During an initialization or initial timing procedure, an output of the first latch 311 may be set to the high level and outputs of the remaining second to eighth latches 312-318 may be set to the low levels. Afterwards, if the counter clock CLK which is synchronized with the comparator output signal CDS_OUT received from the clock generator 110, each latch may receive a positive output Q of its preceding stage, shift a high level pulse from the preceding stage to the next stage, and change its own high level output to the low level when the shifting of the pulse to the next stage was made by a negative output Qb of the next stage.

Meanwhile, the decoder 320 may include first to eighth AND gates 321-328. The decoder 320 may be an optional component suitable for use when the decoder 320 needs to output binary code data rather than decimal code data, and thus may be selectively employed according to the operation of a digital block receiving the output of the decoder 320.

The first AND gate 321 may perform an AND operation on outputs of the first latch 311 and the second latch 312, which may be decimal code bits, and convert the operation result into a binary code bit LSB<0>. The second AND gate 322 may perform an AND operation on outputs of the second latch 312 and the third latch 313 and output the operation result as a binary code bit LSB<1>. The third AND gate 323 may perform an AND operation on outputs of the third latch 313 and the fourth AND gate 314 and output the operation result as a binary code bit LSB<2>. The fourth AND gate 324 may perform an AND operation on outputs of the fourth latch 314 and the fifth latch 315 and output the operation result as a binary code bit LSB<3>. The fifth AND gate 325 may perform an AND operation on outputs of the fifth latch 315 and the sixth latch 316 and output the operation result as a binary code bit LSB<4>. The sixth AND gate 326 may perform an AND operation on outputs of the sixth latch 316 and the seventh latch 317 and output the operation result as a binary code bit LSB<5>. The seventh AND gate 327 may perform an AND operation on outputs of the seventh latch 317 and the eighth latch 318 and output the operation result as a binary code bit LSB<6>. The eighth AND gate 328 may perform an AND operation on outputs of the eighth latch 318 and the first etch 311 and output the operation result as a binary code bit LSB<7>.

Figure 5:
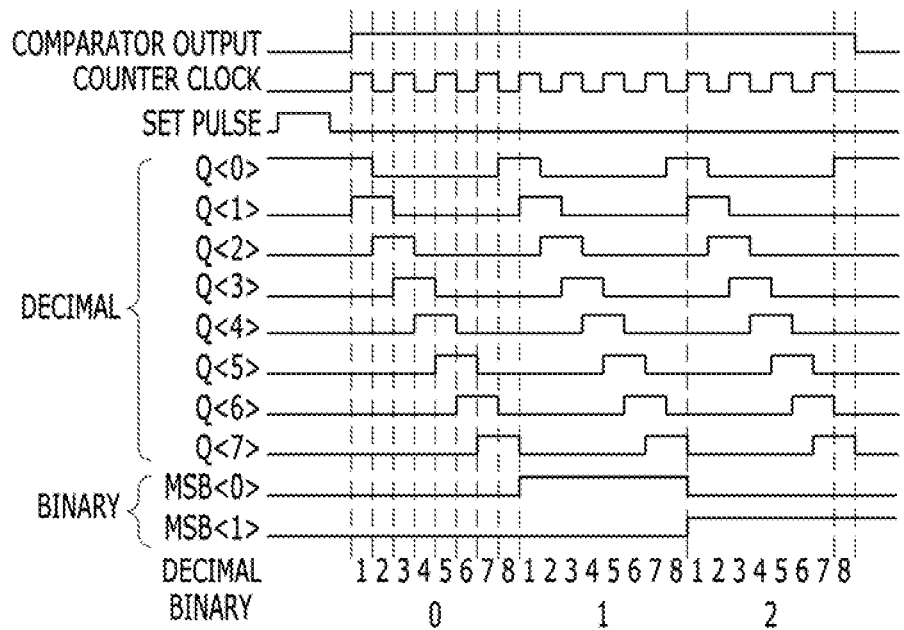
FIG. 5 is a timing chart of a hybrid counter and a DDR ring counter in accordance with an embodiment of the present invention.

FIG. 5 is a timing chart of the hybrid counter of FIG. 3 and the DDR ring counter of FIG. 4, and represents an operation of the hybrid counter 300 in case that the hybrid counter 300 may include the DDR ring counter 310 comprised of eight latches and the binary counter 330 comprised of two flip-flops.

First, a set pulse signal SET_PULSE may be inputted to initialize the first to eighth latches 311-318. Accordingly, the output of the first latch 311 may be set to the high level and the outputs of the remaining second to eighth latches 312-318 may be set to the low level.

Subsequently, a positive output Q<0> of the first latch 311 may be changed from the high level to the low level by the low level of a negative output Qb<1> of the second latch 312 and the low level of the counter clock signal CLK in synchronicity with a falling edge of the counter clock signal CLK owing to the operation of a feedback input unit which will be described with reference to FIG. 6A. The output of the first latch 311 may maintain the low level until a positive output Q<7> of the eighth latch 318 and the counter clock CLK attain the high level by the operation of an input unit which will be described with reference to FIG. 6A.

In the meantime, a positive output Q<1> of the second latch 312 may be changed from the low level to the high level by the high level of both the positive output Q<0> of the first latch 311 and the counter clock signal CLK, and may be changed from the high level to the low level by the low level of both the negative output Qb<2> of the third latch 313 and the counter clock signal CLK. Also, the second latch 312 may maintain the positive output Q<1> until the positive output Q<0> of the first latch 311 and the counter clock CLK may attain the high level. The outputs of the third to eighth latches 313-318 may be similar to the outputs Q<0> and Q<1> described above.

Figure 6A:
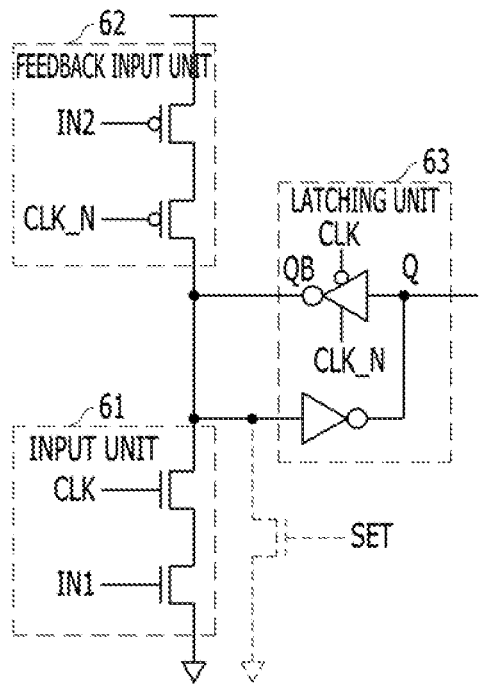
FIGS. 6A through 6C are detailed circuit diagrams of latches in accordance with an embodiment of the present invention.
Figure 6B:
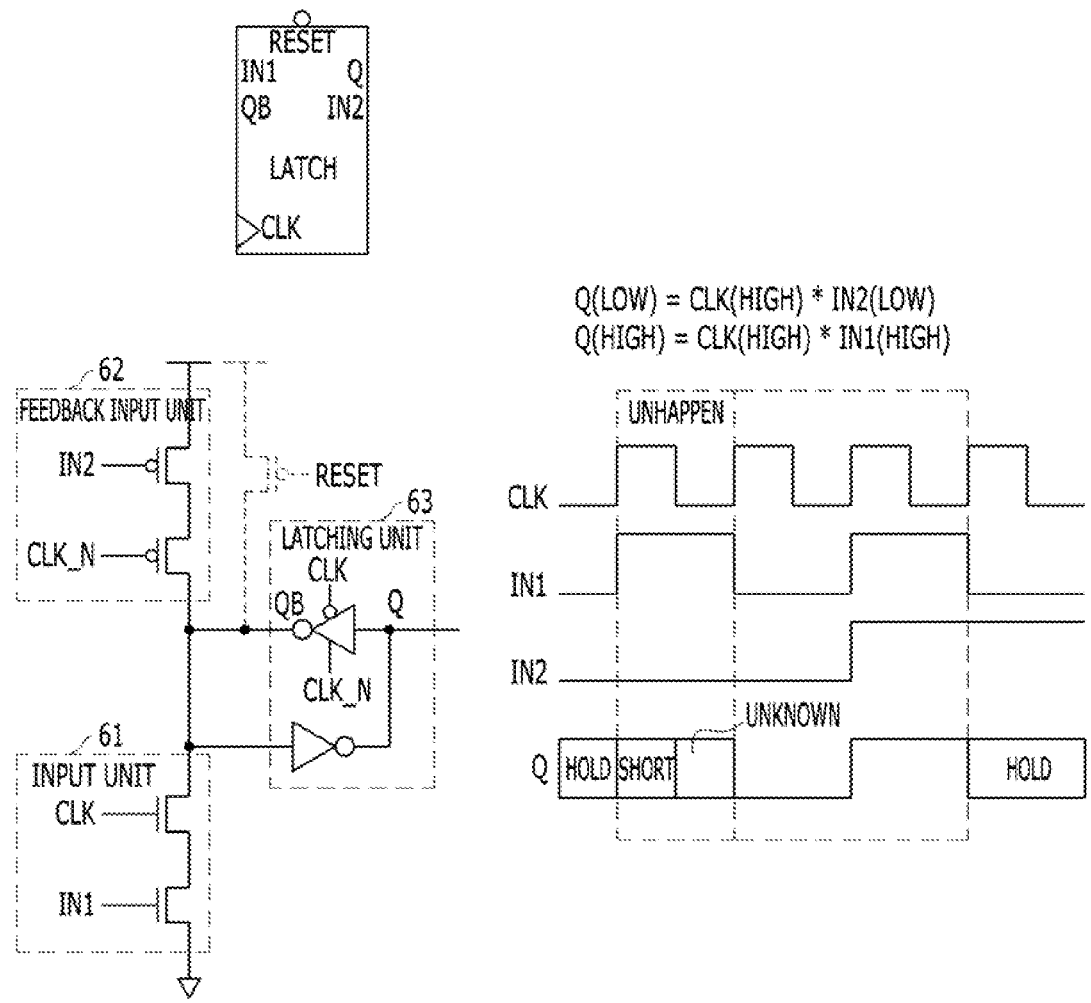
Figure 6C:
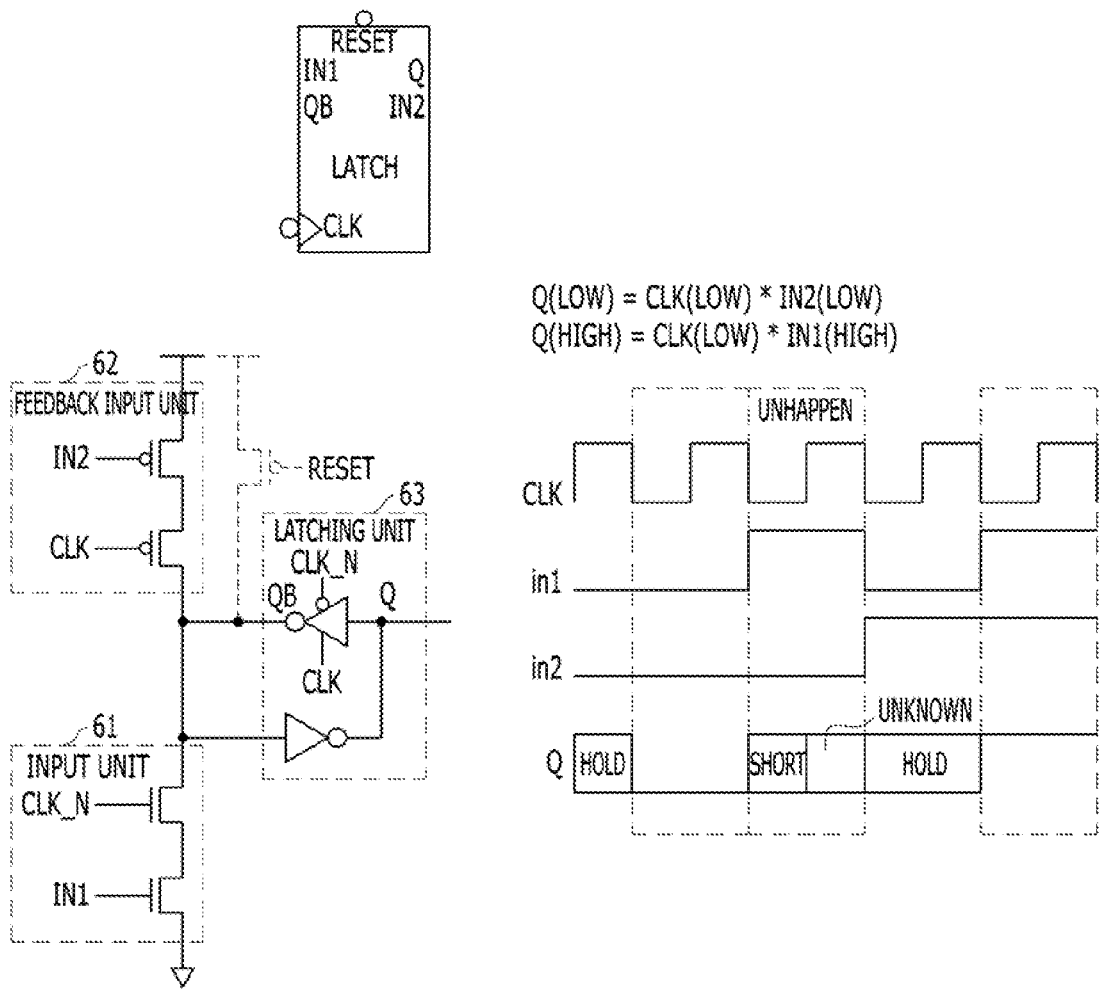

FIGS. 6A through 6C are detailed circuit diagrams of the latches in accordance with an embodiment of the present invention, FIG. 6A illustrates a positive-edge-triggered latch with set input. FIG. 6B illustrates a positive-edge-triggered latch with reset input along with a timing chart thereof. FIG. 6C illustrates a negative-edge-triggered latch with reset input along with a timing chart thereof.

The initialization voltage for the latch with set input may differ from that of the latch with reset input. For example, since the output Q<0> of the first latch 311 in FIG. 4 may start from the high level as shown in FIG. 5, an input node of an inverter in its latching unit 63 shown in FIG. 6A is to be pulled down to a ground voltage level. Thus, the set pulse SET of the high level inputted initially to a set terminal of the latch may pull the input node of the inverter in the latching unit 63 down to the ground voltage level.

The outputs of the second to eighth latches 312-318 in FIG. 4 may start from the low level as shown in FIG. 5, and the input node of the inverter in their latching units 63 is to be pulled up to a supply voltage level. Thus, the set pulse SET of the low level inputted initially to a reset terminal of the latching unit 63 shown in FIG. 6B or 6C may pull the input node of the inverter in the latching unit 63 up to the supply voltage level.

As shown in FIGS. 6A-6C, the latch in accordance with an embodiment of the present invention may include an input unit 61 configured to use the counter clock CLK and the output of the preceding latch stage as inputs, a feedback input unit 62 configured to use an inverted counter clock CLK_N and the negative output of the next latch stage as inputs, and a latching unit 63 configured to hold data according to the clock state.

The input unit 61 may be configured so that the current latch stage may output the high level when both the output of the preceding latch stage and the counter clock CLK (alternatively, the inverted counter clock CLK_N) are at the high level.

The feedback input unit 62 may receive the inverted counter clock CLK_N and the negative output of the next stage to allow the output of the current latch stage to fall to the low level when the output of the next latch stage is changed to the high level. Since the feedback input unit 62 may be implemented by use of PMOS input stages, the feedback input unit 62 may be turned on when both the inverted counter clock CLK_N (alternatively the counter clock CLK) and the negative output of the next stage are activated to the low level contrary to the NMOS input stages.

Here, the latches may be arranged so that the clock phases may be opposite to each other between the preceding latch stage and the current latch stage and between the current latch stage and the next latch stage. Such a latch arrangement may be accomplished by alternately arranging the positive-edge-triggered latches and the negative-edge-triggered latches. As a result, the state transition timing of the current latch stage may be shifted by half a shifting clock period compared with the preceding latch stage, thereby enabling the double data rate operation.

Also, the clock phase of the latching unit 63 may be set to be opposite to that of the input unit 61 to prevent a floating state of the latching unit 63 in an interval that the output of the preceding latch stage inputted through a first input terminal IN1 in the input unit 61 may be at the low level and the output of the next latch stage inputted through a second input terminal IN2 in the feedback input unit 62 may be at the high level.

Referring to FIG. 6B, in the positive-edge-triggered latch with reset input, the output Q of the latch may be at the high level when both the output of the preceding latch stage inputted to a first input terminal IN1 in the input unit 61 and the counter clock CLK are at the high level.

Also, the output Q of the latch may fall to the low level when the negative output of the next latch stage inputted to a second input terminal IN2 in the feedback input unit 62 may be at the low level and the inverted counter clock CLK_N may fail to the low level (i.e., the counter clock CLK may rise to the high level).

If the output of the preceding latch stage inputted to the first input terminal IN1 is at the high level and the negative output of the next latch stage inputted to the second input terminal IN2 is at the low level when the counter clock CLK rises to the high level, a short path may be formed between the supply voltage level and the ground voltage level of the latching unit 63, rendering the output Q of the latch unknown. However, it is impossible that the high and low level signals may be simultaneously inputted to the first and second input terminals IN1 and IN2, respectively, in a structure that the positive-edge-triggered latches and the negative-edge-triggered latches may be arranged alternately as described above.

Meanwhile, during an interval when the counter clock CLK may be at the low level in the positive-edge-triggered latch, the current latch stage may maintain a state holding the output of the preceding latch stage.

Referring to FIG. 6C, in the negative-edge-triggered latch with reset input, the output Q of the latch may be at the high level when the output of the preceding latch stage inputted to the first input terminal IN1 may be at the high level and the inverted counter clock CLK_N may be at the high level (i.e., the counter clock CLK may fall to the low level).

Also, the output Q of the latch may fall to the low level when the negative output of the next latch stage inputted to the second input terminal IN2 is at the low level and the counter clock CLK may fall to the low level.

If the output of the preceding latch stage inputted to the first input terminal IN1 is at the high level and the negative output of the next latch stage inputted to the second input terminal IN2 is at the low level when the counter clock CLK falls to the low level, a short path may be formed between the supply voltage level and the ground voltage level, rendering the output Q of the latch unknown. However it is impossible that the high and low level signals may be simultaneously inputted to the first and second input terminals IN1 and IN2, respectively, in a structure that the positive-edge-triggered latches and the negative-edge-triggered latches may be arranged alternately as described above.

Meanwhile, during an interval when the counter clock CLK may be at the high level in the negative-edge-triggered latch, the current latch stage may maintain the state holding the output of the preceding latch stage.

Figure 7:
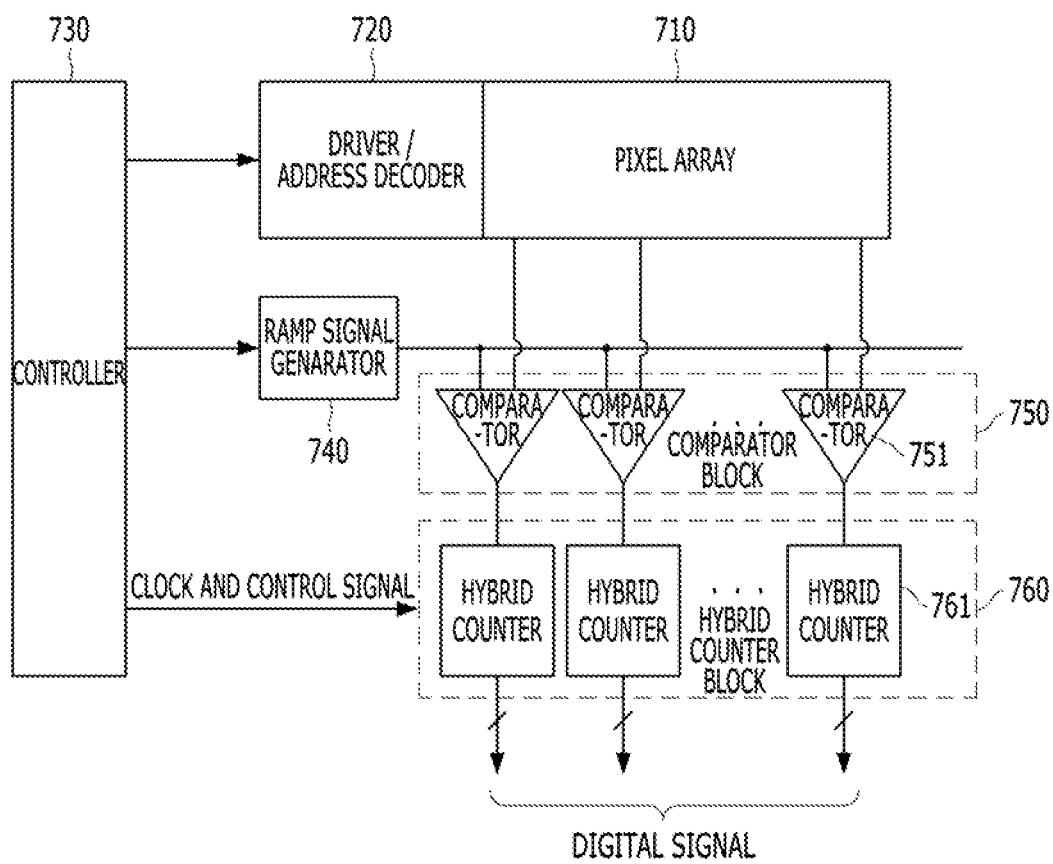
FIG. 7 is a block diagram of a CMOS image sensor in accordance with an embodiment of the present invention.

Referring to FIG. 7, the CMOS image sensor in accordance with an embodiment of the present invention may include a pixel array 710, a driver and address decoder 720, a controller 730, a ramp signal generator 740, a comparator block 750, and a hybrid counter block 760.

The pixel array 710 may include a plurality of unit pixels arranged to convert an incident light into an electrical analog signal. The driver and address decoder 720 may control an operation of the pixel array 710 on row by row basis. The controller 730 may generate clocks and control signals for controlling operation timings of the components of the CMOS image sensor. The clocks and control signals generated by the controller 730 may include the clock CLK and an initialization signal, e.g., the set pulse signal SET_PULSE. The ramp signal generator 740 may generate a ramp signal, to be used as a reference signal, under the control of the controller 730 to output to the comparator block 750.

An analog pixel signal read from the pixel array 710 may be converted into a digital signal by an analog-to-digital converter including the comparator block 750 and the hybrid counter block 760. The analog pixel signal may be detected and processed on column by column basis. For this operation, the comparator block 750 may include a plurality of comparators 751, each of which may be provided for respective columns and compare the analog pixel signal with a reference signals, i.e., the ramp signal. The hybrid counter block 760 may include a plurality of hybrid counters 761, each of which may be provided for respective columns. As the plurality of signal processing circuits provided on column by column basis process pixel signals corresponding to one row in parallel simultaneously, the CMOS sensor may show an improved performance in terms of bandwidth and noise, and may allow high speed operation.

The pixel array 710 sequentially may outputs a first analog signal representing a reset component for correlated double sampling and a second analog signal representing an image signal component including the reset component. Based on the first and second analog signals, the analog-to-digital converter including the comparator block 750 and the hybrid counter block 760 may perform, in digital domain, the correlated double sampling, i.e., digital double sampling (DDS). Here, the DDS may be adopted to eliminate deviations of the single-slope ADC circuits among the columns in a column parallel structure.

The analog-to-digital converter may count the first analog signal representing the reset component and the second analog signal representing the image signal component. Based on two count results, a digital signal corresponding to a difference between the first and second analog signals may be generated.

Although various embodiments have been described for illustrative purposes, it will be apparent to those skilled in the art that various changes and modifications may be made without departing from the spirit and or scope of the invention as defined in the following claims.

What is claimed is:

1. A latch circuit comprising:
an input unit suitable for using a counter clock and an output of a preceding latch stage;
a feedback input unit suitable for using the counter clock and an output of a next latch stage; and
a latching unit suitable for holding data according to a state of the counter clock,
wherein, when the output of the next latch stage is changed to a high level, the feedback input unit receives a negative output of the next latch stage to change an output of a current latch stage to a low level according to the counter clock.

2. A latch circuit comprising:
an input unit suitable for using a counter clock and an output of a preceding latch stage;
a feedback input unit suitable for using the counter clock and an output of a next latch stage; and
a latching unit suitable for holding data according to a state of the counter clock,
wherein phases of the counter clock are arranged to be opposite to each other between the preceding latch stage and a current latch stage and between the current latch stage and the next latch stage.

3. A double data rate ring counter comprising:
a plurality of latches coupled in a ring type,
wherein the plurality of latches comprise positive-edge-triggered latches and negative-edge-triggered latches arranged alternately, and
wherein a current latch stage receives an output of a preceding latch stage to shift to a next latch stage according to a counter clock, receives an output of the next latch stage to check a data shift to the next latch stage, and falls to a low level if the data shift is made,
wherein each of the plurality of latches comprises:
an input unit suitable for using the counter clock and the output of the preceding latch stage;
a feedback input unit suitable for using the counter clock and the output of the next latch stage; and
a latching unit suitable for holding data according to a state of the counter clock.

4. The double data rate ring counter of claim 3, further comprising:
a first latch having a set input terminal and suitable for receiving the counter clock from a clock controller through a clock terminal thereof, receiving a positive output of an n-th latch through a first input terminal thereof, and receiving a negative output of the next latch stage through a second input terminal thereof;
an (n−1)-th latch having a reset input terminal and suitable for receiving the counter clock through a clock terminal or an inverted clock terminal thereof, receiving a positive output of the first latch through a first input terminal thereof, and receiving a negative output of the next latch stage through a second input terminal thereof; and
the n-th latch having a reset input terminal and suitable for receiving the counter clock through an inverted clock terminal thereof, receiving a positive output of the (n−1)-th latch through a first input terminal thereof, and receiving a negative output of the first latch through a second input terminal thereof.

5. The double data rate ring counter of claim 3, wherein, when the output of the next latch stage is changed to a high level, the feedback input unit receives a negative output of the next latch stage and changes an output of a current latch stage to a low level according to the counter clock.

6. The double data rate ring counter of claim 3, wherein phases of the counter clock are arranged to be opposite to each other between the preceding latch stage and the current latch stage and between the current latch stage and next latch stage.

7. A hybrid counting device comprising:
a latch-based double data rate ring counter suitable for counting a signal according to a counter clock and outputting lower bits of a count result in a decimal code; and
a binary counter suitable for receiving a most significant bit of the count result from the latch-based double data rate ring counter and counting the most significant bit to output upper bits of the count result.

8. The hybrid counting device of claim 7, further comprising:
a decoder suitable for receiving the lower bits of the count result of the decimal code and converting the decimal code to a binary code to output the lower bits of the count result of the binary code.

9. The hybrid counting device of claim 8, wherein the decoder comprises:
a plurality of AND gates each suitable for performing an AND operation on positive outputs in the decimal code from two adjacent latches in latch-based double data rate ring counter to convert the decimal code to the binary code and output the lower bits of the count result of the binary code.

10. The hybrid counting device of claim 7, wherein the latch-based double data rate ring counter comprises:
a plurality of latches arranged in a ring type;
wherein the plurality of latches comprises positive-edge-triggered latches and negative-edge-triggered latches arranged alternately, and
wherein a current latch stage receives an output of a preceding latch stage to shift to a next latch stage according to a counter clock, receives an output of the next latch stage to check a data shift to the next latch stage, and falls to a low level if the data shift is made.

11. The hybrid counting device of claim 10, wherein the latch-based double data rate ring counter further comprises:
a first latch having a set input terminal and suitable for receiving the counter clock from a clock controller through a clock terminal thereof, receiving a positive output of an n-th latch through a first input terminal thereof, and receiving a negative output of the next latch stage through a second input terminal thereof;
an (n−1)-th latch having a reset input terminal and suitable for receiving the counter clock through a clock terminal or an inverted clock terminal thereof, receiving a positive output of the first latch through a first input terminal thereof, and receiving a negative output of the next latch stage through a second input terminal thereof; and
the n-th latch having a reset input terminal and suitable for receiving the counter clock through an inverted clock terminal thereof, receiving a positive output of the (n−1)-th latch through a first input terminal thereof, and receiving a negative output of the first latch through a second input terminal thereof.

12. The hybrid counting device of claim 10, wherein each of the plurality of latches comprises:
an input unit suitable for using the counter clock and the output of the preceding latch stage;
a feedback input unit suitable for using the counter clock and the output of the next latch stage; and
a latching unit suitable for holding data according to a state of the counter clock.

13. The hybrid counting device of claim 12, wherein, when the output of the next latch stage is changed to a high level, the feedback input unit receives a negative output of the next latch stage and changes an output of the current latch stage to a low level according to the counter clock.

14. The hybrid counting device of claim 12, wherein, in the latch-based double data rate ring counter, phases of the counter clock are arranged to be opposite to each other between the preceding latch stage and the current stage latch and between the current stage latch and next stage latch.

15. An analog-to-digital converting device comprising:
a comparator suitable for comparing an analog signal with a reference signal and generating a comparator output signal; and
a hybrid counter suitable for performing a counting operation on the comparator output signal to generate a digital signal corresponding to the analog signal,
wherein the hybrid counter comprises:
a latch-based double data rate ring counter suitable for counting the analog signal according to a counter clock and outputting lower bits of the digital signal in a decimal code; and
a binary counter suitable for receiving a most significant bit of a count result from the latch-based double data rate ring counter and counting the most significant bit to output upper bits of the digital signal.

16. The analog-to-digital converting device of claim 15, wherein the hybrid counter further comprises:
a decoder suitable for receiving the lower bits of the digital signal of the decimal code and converting the decimal code to a binary code to output the lower bits of the digital signal of the binary code.

17. The analog-to-digital converting device of claim 15, wherein the latch-based double data rate ring counter comprises:
a plurality of latches arranged in a ring type;
wherein the plurality of latches comprises positive-edge-triggered latches and negative-edge-triggered latches arranged alternately, and
wherein a current latch stage receives an output of a preceding latch stage to shift to a next latch stage according to a counter clock, receives an output of the next latch stage to check a data shift to the next stage latch, and falls to a low level if the data shift is made.

18. The analog-to-digital converting device of claim 17, wherein each of the plurality of latches comprises:
an input unit suitable for using the counter clock and the output of the preceding latch stage;
a feedback input unit suitable for using the counter clock and the output of the next latch stage; and
a latching unit suitable for holding data according to a state of the counter clock.

19. A CMOS image sensor comprising:
a pixel array suitable for generating an analog signal corresponding to an incident light;
an analog-to-digital converter suitable for comparing the analog signal with a reference signal and generating a digital signal corresponding to the analog signal by use of a hybrid counter; and
a controller suitable for controlling the pixel array and the analog-to-digital converter, wherein the hybrid counter comprises:
- a latch-based double data rate ring counter suitable for counting the analog signal according to a counter clock and outputting lower bits of the digital signal in a decimal code; and
- a binary counter suitable for receiving a most significant bit of a count result from the latch-based double data rate ring counter and counting the most significant bit to output upper bits of the digital signal.

20. The CMOS image sensor of claim 19, wherein the hybrid counter further comprises:
- a decoder suitable for receiving the lower bits of the digital signal of the decimal code and converting the decimal code to a binary code to output the lower bits of the digital signal of the binary code.

21. The CMOS image sensor of claim 19, wherein the latch-based double data rate ring counter comprises:
- a plurality of latches arranged in a ring type;
- wherein the plurality of latches comprises positive-edge-triggered latches and negative-edge-triggered latches arranged alternately, and
- wherein a current latch stage receives an output of a preceding latch stage to shift to a next latch stage according to a counter clock, receives an output of the next latch stage to check a data shift to the next latch stage, and falls to a low level if the data shift is made.

22. The CMOS image sensor of claim 21, wherein each of the plurality of latches comprises:
- an input unit suitable for using the counter clock and the output of the preceding latch stage;
- a feedback input unit suitable for using the counter clock and the output of the next latch stage; and
- a latching unit suitable for holding data according to a state of the counter clock.

* * * * *